(12) United States Patent
Matsuda et al.

(10) Patent No.: US 12,255,600 B2
(45) Date of Patent: *Mar. 18, 2025

(54) METHODS OF MANUFACTURING ACOUSTIC WAVE DEVICE WITH ANTI-REFLECTION LAYER

(71) Applicant: Skyworks Solutions, Inc., Irvine, CA (US)

(72) Inventors: Satoru Matsuda, Toyonaka (JP); Tatsuya Fujii, Nagaokakyo (JP); Yoshiro Kabe, Kobe (JP); Kenji Nagano, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/511,405

(22) Filed: Nov. 16, 2023

(65) Prior Publication Data

US 2024/0088865 A1    Mar. 14, 2024

Related U.S. Application Data

(60) Continuation of application No. 17/657,533, filed on Mar. 31, 2022, now Pat. No. 11,855,603, which is a
(Continued)

(51) Int. Cl.
*H03H 3/08* (2006.01)
*H03H 9/02* (2006.01)
(Continued)

(52) U.S. Cl.
CPC .......... *H03H 3/08* (2013.01); *H03H 9/02559* (2013.01); *H03H 9/02574* (2013.01);
(Continued)

(58) Field of Classification Search
CPC .......... H03H 9/02574; H03H 9/02559; H03H 9/02834; H03H 9/02842; H03H 9/14502;
(Continued)

(56) References Cited

U.S. PATENT DOCUMENTS 5,286,608 A    2/1994    Koh
6,821,712 B2   11/2004   Sakaguchi et al.
(Continued)

FOREIGN PATENT DOCUMENTS

EP    0123301    10/1984
JP    3999757    10/2007
JP    4182167    11/2008

*Primary Examiner* — Jorge L Salazar, Jr.
(74) *Attorney, Agent, or Firm* — Knobbe, Martens, Olson & Bear, LLP

(57) ABSTRACT

An acoustic wave device is disclosed. The acoustic wave device includes a piezoelectric layer, an interdigital transducer electrode positioned over the piezoelectric layer, and an anti-refection layer over a conductive layer of the interdigital transducer electrode. The conductive layer can include aluminum, for example. The anti-reflection layer can include silicon. The anti-reflection layer can be free from a material of the interdigital transducer electrode. The acoustic wave device can further include a temperature compensation layer positioned over the anti-reflection layer in certain embodiments.

20 Claims, 15 Drawing Sheets

Related U.S. Application Data division of application No. 16/790,408, filed on Feb. 13, 2020, now Pat. No. 11,394,364.

(60) Provisional application No. 62/806,560, filed on Feb. 15, 2019.

(51) Int. Cl.
    *H03H 9/145* (2006.01)
    *H03H 9/25* (2006.01)
    *H03H 9/64* (2006.01)
    *H03H 9/72* (2006.01)

(52) U.S. Cl.
    CPC .... *H03H 9/02834* (2013.01); *H03H 9/02842* (2013.01); *H03H 9/14502* (2013.01); *H03H 9/14541* (2013.01); *H03H 9/25* (2013.01); *H03H 9/6406* (2013.01); *H03H 9/725* (2013.01)

(58) Field of Classification Search
    CPC .... H03H 9/14541; H03H 9/25; H03H 9/6406; H03H 9/725; H03H 3/02; H03H 3/08; H03H 9/0211; H03H 9/02228; H03H 9/173; H03H 9/175
    USPC .......................................... 333/133, 193–196
    See application file for complete search history.

(56) References Cited

U.S. PATENT DOCUMENTS

| | | |
|---|---|---|
| 11,394,364 B2 | 7/2022 | Matsuda et al. |
| 11,855,603 B2 | 12/2023 | Matsuda et al. |
| 2004/0222717 A1 | 11/2004 | Matsuda et al. |
| 2020/0036361 A1 | 1/2020 | Mimura |
| 2020/0266796 A1 | 8/2020 | Matsuda et al. |
| 2022/0224308 A1 | 7/2022 | Matsuda et al. |

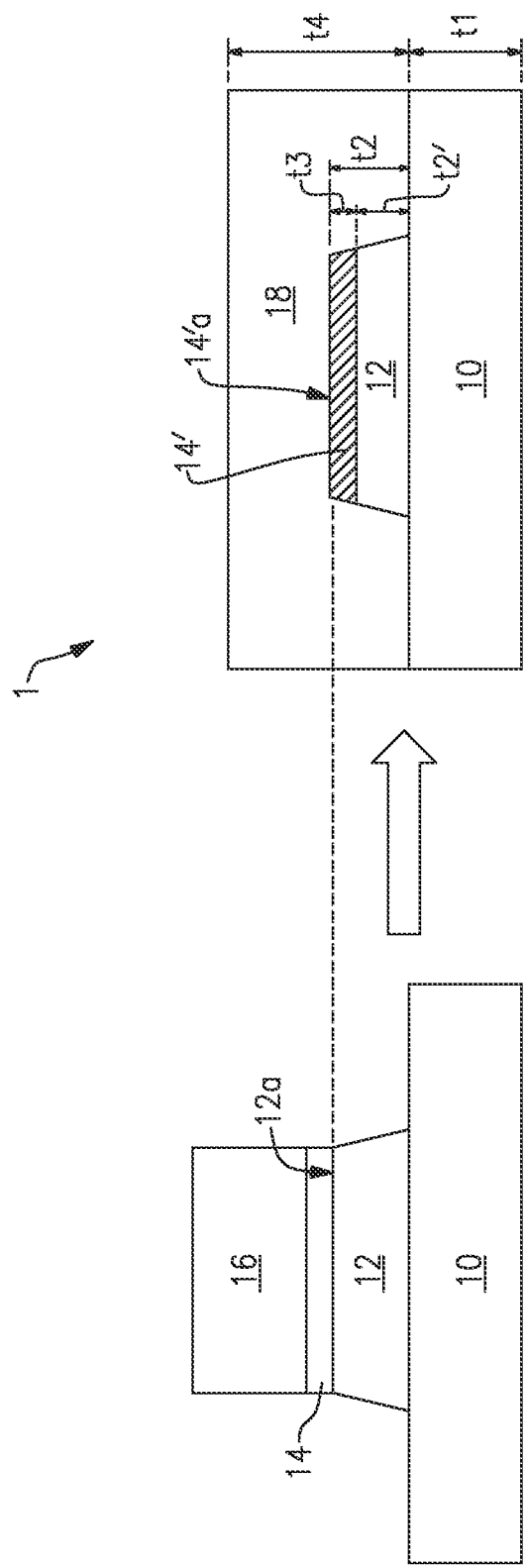

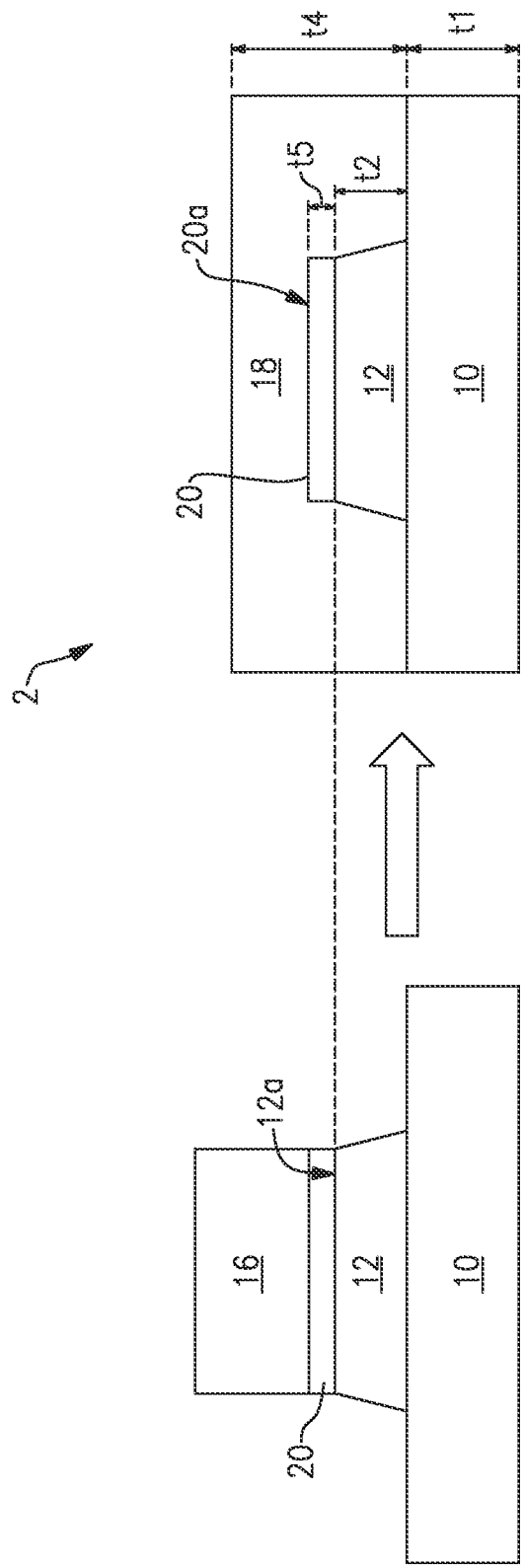

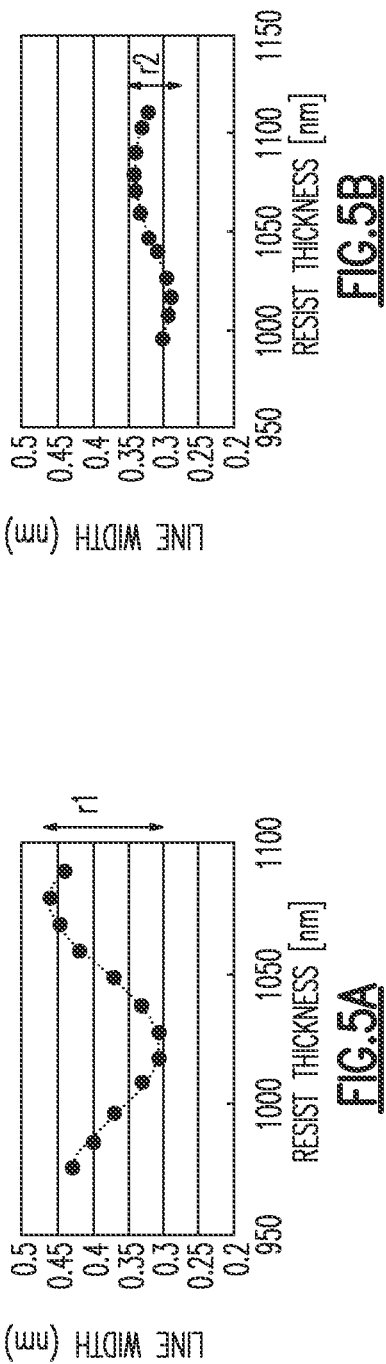
FIG. 5A WITHOUT ANTI-REFLECTION MATERIAL
FIG. 5B WITH EPOXY RESIN
FIG. 5C WITH a-Si
FIG. 5D WITH SiON

METHODS OF MANUFACTURING ACOUSTIC WAVE DEVICE WITH ANTI-REFLECTION LAYER

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a piezoelectric layer, and an interdigital transducer electrode positioned over the piezoelectric layer. The interdigital transducer electrode includes a conductive layer. The acoustic wave device can also include an anti-reflection layer positioned over the conductive layer. The anti-reflection layer includes silicon. The acoustic wave device can further include a temperature compensation layer over the anti-reflection layer.

In an embodiment, the anti-reflection layer is a silicon oxynitride layer. The silicon oxynitride layer can have a thickness in a range from 100 nanometers to 120 nanometers.

In an embodiment, the anti-reflection layer is an amorphous silicon layer. The amorphous silicon layer can have a thickness in a range from 5 nanometers to 15 nanometers.

In an embodiment, the anti-reflection layer includes a material and has a thickness that together cause reflectivity of the acoustic wave device to be less than or equal to 0.2 for light having a wavelength of 365 nanometers. The anti-reflection layer contributes to less than 2 percent of wiring resistance of the acoustic wave device.

In an embodiment, the conductive layer is in physical contact with the anti-reflection layer.

In an embodiment, the interdigital transducer includes a metal layer positioned between the conductive layer and the piezoelectric layer.

In an embodiment, the acoustic wave device further including a substrate layer. The piezoelectric layer can be on the substrate layer.

In an embodiment, an acoustic wave filter includes acoustic wave devices arranged to filter a radio frequency signal. The acoustic wave devices include the acoustic wave device. A front end module can include the acoustic wave filter, additional circuitry, and a package enclosing the acoustic wave filter and the additional circuitry. The additional circuitry can include a multi-throw radio frequency switch. The additional circuitry can include a power amplifier. The acoustic wave filter can be included in a duplexer. A wireless communication device can include an antenna and the acoustic wave filter. The acoustic wave filter can be arranged to filter a radio frequency signal associated with the antenna.

In an embodiment, the conductive layer is an aluminum layer. The conductive layer can have a reflectivity of at least 0.5 for light having a wavelength of 365 nanometers.

The acoustic wave device can be an acoustic wave resonator. The acoustic wave resonator can be a surface acoustic wave resonator.

In one aspect, an acoustic wave device is disclosed. The acoustic wave device can include a piezoelectric layer, a interdigital transducer electrode positioned over the piezoelectric layer, and an anti-reflection layer over the interdigital transducer electrode. The interdigital transducer electrode can include a first interdigital transducer electrode finger extending from a first bus bar and a second interdigital transducer finger extending from a second bus bar. The first interdigital transducer electrode finger and the second interdigital transducer electrode finger can be spaced apart from each other by a gap. The anti-reflection layer can include silicon. The anti-reflection layer can be free from material of the interdigital transducer electrode. The piezoelectric layer can be free from the anti-reflection layer under the gap.

The acoustic wave device further includes a temperature compensation layer over the anti-reflection layer.

In an embodiment, the anti-reflection layer is an amorphous silicon layer. the amorphous silicon layer can have a thickness in a range from 5 nanometers to 15 nanometers.

The acoustic wave device of claim 8 wherein the anti-reflection layer is a silicon oxynitride layer. The silicon oxide layer can have a thickness in a range from 100 nanometers to 120 nanometers.

In an embodiment, the interdigital transducer electrode includes an aluminum layer. The anti-reflection layer can be in physical contact with the aluminum layer. The anti-reflection layer can have a reflectivity of 0.2 or less for light having a wavelength of 365 nanometers.

In an embodiment the anti-reflection layer has a reflectivity range from 0.1 to 0.2 at the wavelength of 365 nanometers.

In an embodiment, a line width distribution of the interdigital transducer electrode is 2% of the line width or less.

In an embodiment, the acoustic wave device further includes a support substrate. The piezoelectric layer can be over the support substrate. The support substrate can have a higher impedance than the piezoelectric layer.

The acoustic wave device can be configured to generate a surface acoustic wave.

In one aspect, a method of manufacturing an acoustic wave device is disclosed, the method can include providing an acoustic wave device structure with one or more interdigital transducer electrode layers on a piezoelectric layer. The one or more interdigital transducer electrode layers including a conductive layer. The method can also include forming an anti-reflection layer over the conductive layer. The anti-reflection layer includes silicon. The method further includes performing a photolithography processes to pattern an interdigital transducer electrode from one or more interdigital transducer electrode layers. The anti-reflection layer reduces reflection from the conductive layer during the photolithography process.

In an embodiment, the conductive layer includes aluminum.

In an embodiment, the anti-reflection layer is a silicon oxynitride layer.

In an embodiment, the anti-reflection layer is an amorphous silicon layer.

In an embodiment, the anti-reflection layer has a reflectivity of 0.2 or less for light having a wavelength of 365 nanometers.

In an embodiment, the conductive layer has a reflectivity of at least 0.5 for light having a wavelength of 365 nanometers.

In an embodiment, the method further includes forming a temperature compensation layer over the anti-reflection layer.

In an embodiment, the anti-reflection material remains distinct from the aluminum layer after a heating process.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 1A illustrates a cross section of a surface acoustic wave (SAW) resonator structure at a stage of a manufacturing process.

FIG. 1B illustrates a cross section of a surface acoustic wave resonator formed from the surface acoustic wave resonator structure illustrated in FIG. 1A.

FIG. 2A illustrates a cross section of a SAW resonator structure at a stage of a manufacturing process according to an embodiment.

FIG. 2B illustrates a cross section of a SAW resonator formed from the SAW resonator structure illustrated in FIG. 2A according to an embodiment.

FIG. 5A is a graph of measurement results of line widths for different resist thicknesses of a resist film of a SAW resonator without an anti-reflection layer.

FIG. 5B is a graph of measurement results of line widths for different resist thicknesses of a resist film of a SAW resonator structure with epoxy resin over an interdigital transducer (IDT) electrode.

FIG. 5C is a graph of measurement results of line widths for different resist thicknesses of a resist film of a SAW resonator structure with an anti-reflection layer over an IDT electrode according to an embodiment.

FIG. 5D is a graph of measurement results of line widths for different resist thicknesses of a resist film of a SAW resonator structure with an anti-reflection layer over an IDT electrode according to another embodiment.

DETAILED DESCRIPTION OF CERTAIN EMBODIMENTS

Figure 3B:
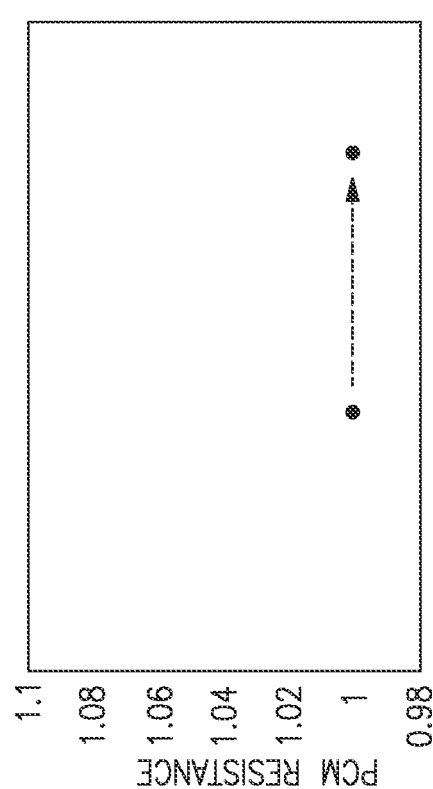
FIG. 3B is a graph showing a reference wiring resistance measurement and a wiring resistance measurement of the SAW resonator illustrated in FIG. 2B.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The SAW devices include SAW resonators, SAW delay lines, and multi-mode SAW (MMS) filters (e.g., double mode SAW (DMS) filters).

A manufacturing process for a SAW device can include a photolithography process. In certain photolithography processes, some undesirable effects can occur. For example, light used in the photolithography process can reflect back, which can cause standing waves and/or swing curves. For SAW resonators that include an interdigital transducer (IDT) electrode with a relatively high reflectivity material, such as an aluminum IDT electrode, reflection from the IDT electrode is relatively high. Reflection from aluminum IDT electrode layers has presented technical challenges in manufacturing IDT electrode patterns with certain line widths in a photolithography process.

One approach to eliminate and/or mitigate such undesirable effects is to include an anti-reflection material over the aluminum IDT electrode layer. An anti-reflection epoxy resin film can suppress the reflectivity of an aluminum layer. Fixing properties of an epoxy resin anti-reflection film can involve a heating process. However, in such a heating process, the aluminum IDT electrode layer can react with the anti-reflection film to form a compound layer with carbon and aluminum. The thickness of the compound layer can be about 10 nanometers (nm) to 20 nm. This thickness can be about 10% to 15% of the thickness of the aluminum IDT electrode. The compound layer can be sparse and a wiring resistance value measured using a resistance wire test (also referred to as a wiring resistance measurement) with this structure can increase about 10% compared to a similar structure without an anti-reflection resin film. The surface of an aluminum IDT electrode with the compound film can be rough. The compound film can contribute to filter loss and/or larger frequency distribution due to the variable thickness of the compound layer with aluminum and resin throughout a wafer.

Aspects of this disclosure relate to an anti-reflection film over an IDT electrode layer of an acoustic wave device. For example, a SAW resonator can include a piezoelectric layer, an IDT electrode over the piezoelectric layer, and an anti-reflection layer over the IDT electrode. The anti-reflection layer can include silicon. For example, the anti-reflection layer can be a silicon oxynitride layer or an amorphous silicon layer. Anti-reflection layers disclosed herein can be free from material of an IDT electrode layer in contact with the anti-reflection layer. With such an anti-reflection layer, the wiring resistance value can be substantially the same as a similar structure without an anti-reflection layer. The anti-reflection layer can have a thickness that causes the reflectivity to satisfy a threshold. With anti-reflection layers disclosed herein, IDT electrodes of acoustic wave resonators can be patterned with line widths in a range from 0.25 micrometers (μm) to 0.4 μm in a photolithography process without significant electrical degradation in filters that include such acoustic wave resonators.

Although embodiments may be discussed with reference to SAW resonators, any suitable principles and advantages discussed herein can be applied to any suitable SAW device and/or any other suitable acoustic wave device. Embodiments will now be discussed with reference to drawings. Any suitable combination of features of the embodiments disclosed herein can be implemented together with each other.

FIG. 1A illustrates a cross section of a surface acoustic wave resonator structure at a stage of a manufacturing process. The manufacturing process may include a photolithography process. The illustrated SAW resonator structure in FIG. 1A includes a piezoelectric layer 10, an interdigital transducer (IDT) electrode 12 over the piezoelectric layer 10, an anti-reflection epoxy resin film 14 over the IDT electrode 12, and a resist film 16 over the epoxy resin film 14. The IDT electrode 12 has an upper surface 12a in contact with the epoxy resin film 14. The epoxy resin film 14 is subjected to a heat processing to fix its properties in another stage in the manufacturing process. The epoxy resin film 14 is heated prior to removing the resist film 16. The resist film 16 gets removed later at a later stage in the manufacturing process. For example, the manufacturing process can include: (1) depositing an IDT electrode material layer on the piezoelectric layer 10; (2) coating the anti-reflection epoxy resin film 14 on the IDT electrode material layer; (3) coating the resist film 16 on the anti-reflection epoxy resin film 14; (4) patterning the resist film 16; (5) etching the IDT electrode material layer to form the IDT electrode 12; and (6) removing the resist film 16. The anti-reflection epoxy resin film 14 can mitigate and/or eliminate back reflection of light from the IDT electrode 12 during the photolithography process. As discussed below, this reduction of a reflectivity of the IDT electrode 12 can make a line width range smaller.

FIG. 1B illustrates a cross section of a surface acoustic wave resonator 1 formed using the surface acoustic wave resonator structure illustrated in FIG. 1A. The illustrated SAW resonator 1 includes the piezoelectric layer 10, the IDT electrode 12 over the piezoelectric layer 10, a compound layer 14' over the IDT electrode 12, and a temperature compensation layer 18 over the compound layer 14'.

The piezoelectric layer 10 may include any suitable piezoelectric material, such as a lithium niobate (LN) layer or a lithium tantalate (LT) layer. A thickness t1 of the piezoelectric layer 10 can be selected based on a wavelength λ or L of a surface acoustic wave generated by the surface acoustic wave resonator 1 in certain applications. The IDT electrode 12 has a pitch that sets the wavelength λ or L of the surface acoustic wave resonator 1.

The IDT electrode 12 can be an aluminum (Al) IDT electrode. The IDT electrode 12 has a thickness t2. In some embodiments, the thickness t2 of the IDT electrode 12 can be about 0.05 L. For example, when the wavelength L is 4 μm, the thickness t2 can be 200 nm.

The compound layer 14' is formed when the epoxy resin film 14 is heated and/or the resist film 16 is heated. Carbon included in the resist film 16 can react with a material (e.g., aluminum) of the IDT electrode 12 when heated, forming a compound that includes the material (e.g., aluminum) and carbon. Due to this reaction, relative heights of an upper surface 14a' of the compound layer 14' in FIG. 1B and an upper surface 12a of the IDT electrode in FIG. 1A can be approximately the same. The compound layer 14' has a thickness t3. The thickness t3 may vary along its width. The thickness t3 of the compound layer 14' may depend at least on a thickness of the epoxy resin layer 14 and/or a duration of the heat processing. The thickness t3 of the compound layer 14' can be, for example, in a range from 10 nm to 20 nm. The thickness t3 of the compound layer 14' can be, for example, in a range from 10% to 15% of thickness t2 of the IDT electrode 12.

A final thickness t2' of the IDT electrode 12 may be different from the original IDT electrode thickness t2. For example, the final thickness t2' of the IDT electrode 12 can be approximately the thickness t2 of the original thickness minus the thickness t3 of the compound layer 14'. In certain embodiments, the final thickness t2' can be about 180 nm. However, the IDT electrode 12 may be designed to have a thicker original thickness t2 such that the final thickness t2' after the formation of the compound layer 14' can be about 200 nm or about 0.05 L.

The temperature compensation layer 18 can include any suitable material. For example, the temperature compensation layer 18 can be a silicon dioxide ($SiO_2$) layer. The temperature compensation layer 18 can bring the temperature coefficient of frequency (TCF) of the SAW resonator 1 closer to zero relative to a similar SAW resonator without the temperature compensation layer 18. The temperature compensation layer 18 has a thickness t4.

FIG. 2A illustrates a cross section of a surface acoustic wave resonator structure at a stage of a manufacturing process according to an embodiment. The manufacturing process can include a photolithography process. The illustrated SAW resonator structure of FIG. 2A includes a piezoelectric layer 10, an interdigital transducer (IDT) electrode 12 over the piezoelectric layer 10, an anti-reflection layer 20 over the IDT electrode 12, and a resist film 16 over the anti-reflection layer 20. The resist film 16 can be removed at a later stage in the manufacturing process. For example, the manufacturing process can include: (1) depositing an IDT electrode material layer on the piezoelectric layer 10; (2) forming the anti-reflection layer 20 on the IDT electrode material layer; (3) coating the resist film 16 on the anti-reflection layer 20; (4) patterning the resist film 16; (5) etching the IDT electrode material layer to form the IDT electrode 12; and (6) removing the resist film 16.

The anti-reflection layer 20 can include silicon. For example, the anti-reflection layer 20 can be silicon (Si), silicon oxynitride (SiON), amorphous silicon (a-Si), silicon dioxide ($SiO_2$), or another suitable silicon compound. The anti-reflection layer 20 can be a material that is similar to silicon dioxide. In certain instances, the anti-reflection layer 20 can include a non-silicon material that sufficiently mitigates back reflection in a photolithography process and does not react (e.g., does not form a compound) with the IDT electrode 12. In certain applications, the anti-reflection material can be any suitable material having a reflectivity of 0.3 or less for light having a wavelength of 365 nm. According to some such applications, the anti-reflection material can be any suitable material having a reflectivity of 0.2 or less for light having a wavelength of 365 nm. For example, the reflectivity can be in between 0.01 to 0.2, in some embodiments. In some embodiments, the anti-reflection layer 20 does not include carbon.

FIG. 2B illustrates a cross section of a surface acoustic wave resonator 2 formed using the surface acoustic wave resonator structure illustrated in FIG. 2A according to an embodiment. The SAW resonator 2 and other SAW resonators with a similar temperature compensation layer can be referred to as a temperature compensated SAW (TC-SAW) resonator.

The illustrated SAW resonator 2 includes the piezoelectric layer 10, the IDT electrode 12 over the piezoelectric layer 10, the anti-reflection layer 20 over the IDT electrode 12, and a temperature compensation layer 18 over the anti-reflection layer 20. The SAW resonator 2 illustrated in FIG. 2B includes some generally similar features to the SAW resonator 1 illustrated in FIG. 1B. However, unlike the SAW resonator 1, the SAW resonator 2 does not include the compound layer 14' and includes the anti-reflection layer 20. Unlike the anti-reflection epoxy resin film 14 of FIG. 1A, the anti-reflection layer 20 does not react with the IDT electrode 12. Accordingly, the anti-reflection layer 20 is distinct from the material of the IDT electrode 12. The anti-reflection layer 20 is free from material of the IDT electrode 12. In some embodiments, the chemical properties of the anti-reflection layer 20 can be the same in FIGS. 2A and 2B.

An upper surface 20a of the anti-reflection layer 20 opposite the IDT electrode 12 can be relatively flat in the surface acoustic wave device 2. A surface roughness of the upper surface 20a of the anti-reflection layer 20 can be about 3.5 nm. In some embodiments, the roughness of the upper surface 20a can be in a range from, for example, 3 nm to 4 nm. In some embodiments, the roughness of the upper surface 20a can be less than, for example, 4.5 nm. The smoother and/or flatter surface of upper surface 20a of the anti-reflection layer 20 opposite the IDT electrode 12 relative to the upper surface 14a' of the anti-reflection layer 14' of FIG. 1B can result in less variation in resistance and less electrical degradation in a filter.

The piezoelectric layer 10 may include any suitable piezoelectric material, such as a lithium niobate (LN) layer or a lithium tantalate (LT) layer. A thickness t1 of the piezoelectric layer 10 can be selected based on a wavelength λ or L of a surface acoustic wave generated by the surface acoustic wave resonator 2 in certain applications. The IDT electrode 12 has a pitch that sets the wavelength λ or L of a surface acoustic wave generated by the surface acoustic wave device 2. The piezoelectric layer 10 can be sufficiently thick to avoid significant frequency variation.

Figure 7:
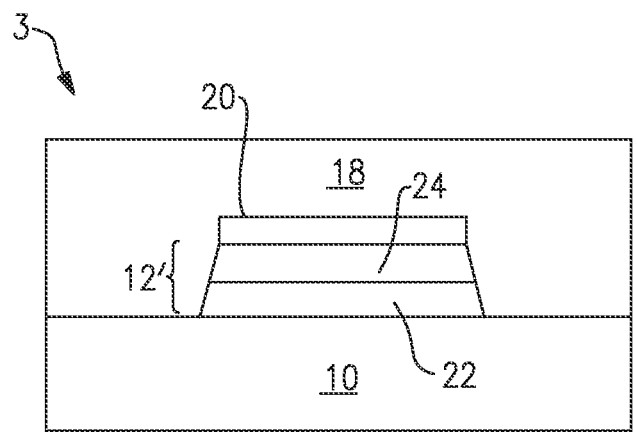
FIG. 7 illustrates a cross section of a SAW resonator according to an embodiment.

The IDT electrode 12 can be an aluminum (Al) IDT electrode. The IDT electrode 12 may include any other suitable IDT material. For example, the IDT electrode 12 may include copper (Cu), magnesium (Mg), titanium (Ti), etc. The IDT electrode 12 may include alloys, such as AlMgCu, AlCu, etc. The IDT electrode 12 can include a conductive layer that has a reflectivity of at least 0.3 for light having a wavelength of 365 nanometers. The IDT electrode 12 can include a conductive layer that has a reflectivity of at least 0.5 for light having a wavelength of 365 nanometers. The IDT electrode 12 can include a conductive layer that has a reflectivity of at least 0.75 for light having a wavelength of 365 nanometers. As shown in FIG. 7, the IDT electrode can be a multi-layer IDT in certain embodiments.

The IDT electrode 12 has a thickness t2. In some embodiments, the thickness t2 of the IDT electrode 12 can be about 0.05 L. For example, when the wavelength L is 4 μm, the thickness t2 can be 200 nm. Unlike the embodiment illustrated in FIG. 1B, the original thickness and the final thickness of the IDT electrode 12 can be the same or very similar in the embodiment in FIGS. 2A and 2B. The thickness t5 of the anti-reflection layer 20 can be in a range from, for example, 0.004 L to 0.06 L or 8 nm to 240 nm. The thickness t2 of the IDT electrode 12 can be about 0.05 L. For example, when the wavelength L is 4 μm, the thickness t2 can be 200 nm.

The anti-reflection layer 20 can have a thickness t5. The thickness t5 can vary for different materials used for the anti-reflection layer 20. Also, the determination of the thickness t5 can be based at least in part on reflectivity of the anti-reflection layer 20 and/or line widths, for instance, as explained below with respect to FIGS. 4A to 6. For example, when the anti-reflection layer 20 is an amorphous silicon layer, the thickness t5 can be about 9 nm (e.g., 0.00225 L when the wavelength L is 4 μm), which can give a reflectivity of 0.07 in some embodiments. For example, when the anti-reflection layer 20 is a silicon oxynitride layer, the thickness t5 can be about 110 nm, which can give a reflectivity of 0.17 in some embodiments.

The temperature compensation layer 18 can include any suitable material. For example, the temperature compensation layer 18 can be a silicon dioxide ($SiO_2$) layer. The temperature compensation layer 18 can be a layer of any other suitable material having a positive temperature coefficient of frequency. For instance, the temperature compensation layer 18 can be a tellurium dioxide ($TeO_2$) layer or a silicon oxyfluoride (SiOF) layer in certain applications. A temperature compensation layer can include any suitable combination of $SiO_2$, $TeO_2$, and/or SiOF.

The temperature compensation layer 18 can bring the temperature coefficient of frequency (TCF) of the SAW resonator 2 closer to zero relative to a similar SAW resonator without the temperature compensation layer 18. The temperature compensation layer 18 together with a lithium niobate piezoelectric layer can improve the electromechanical coupling coefficient ($k^2$) of the SAW resonator 2 relative to a similar SAW resonator with a lithium tantalate piezoelectric layer and without the temperature compensation layer 18. Improved $k^2$ of the temperature compensation layer 18 can be more pronounced when the SAW resonator 2 includes a lithium niobate layer as the piezoelectric layer 10. In certain embodiments, for example, as illustrated in FIGS. 8B and 8C, the temperature compensation layer 18 may be omitted.

The temperature compensation layer 18 has a thickness t4. In some embodiments, the thickness t4 of the temperature compensation layer 18 can be in a range from 0.1 L to 0.5 L. For example, when the wavelength L is 4 μm, the thickness t4 of the temperature compensation layer 14 can be 1200 nm.

Figure 3A:
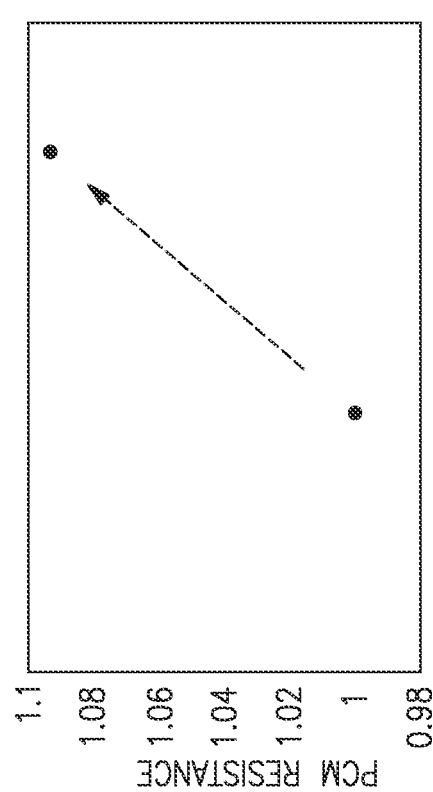
FIG. 3A is a graph showing a reference wiring resistance measurement and a wiring resistance measurement of the SAW resonator illustrated in FIG. 1B.

FIG. 3A is a graph of a reference wiring resistance measurement and a wiring resistance measurement of the SAW resonator 1 illustrated in FIG. 1B. A wiring resistance can be measured using a resistance wire test. A wiring resistance can also be referred to as an IDT resistance or electrode resistance. The reference wiring resistance can be a wiring resistance of a SAW resonator that does not include an anti-reflective material over an IDT electrode. The wiring resistance of the SAW resonator 1 is about 1.09 (e.g., 9% increase from the reference wiring resistance). This can result from the compound layer 14' degrading the performance of the SAW resonator 1 as compared to the reference SAW resonator that does not include the anti-reflective material.

FIG. 3B is a graph of a reference wiring resistance measurement and a wiring resistance measurement of the SAW resonator 2 illustrated in FIG. 2B. The wiring resistance of the SAW resonator 2 is substantially the same or very similar to the reference wiring resistance. In other words, the anti-reflection layer 20 does not noticeably degrade the wiring resistance of the SAW resonator 2 as compared to the reference SAW resonator. Therefore, the SAW resonator 2 illustrated in FIG. 2B may be a more desirable than the SAW resonator 1 illustrated in FIG. 1B in certain applications. The anti-reflection film 20 of the surface acoustic wave resonator 2 of FIG. 2B can contribute less than 2% of wiring resistance.

Figures 4A, 4B:
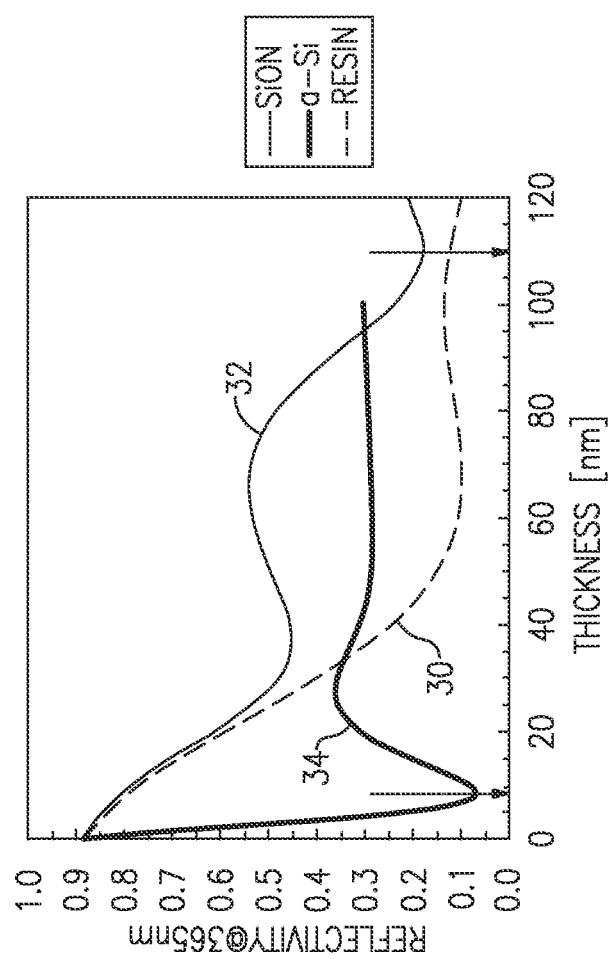
FIG. 4A is a graph showing ellipsometer measurement results of reflectivity of an epoxy resin layer, a silicon oxynitride (SiON) layer, and an amorphous silicon (a-Si) layer at a wavelength of 365 nanometers (nm).
FIG. 4B is a table that includes the lowest reflectivity values and corresponding thicknesses from FIG. 4A for the a-Si layer and the SiON layer.

FIG. 4A is a graph of ellipsometer measurement results of reflectivity of an epoxy resin layer, a silicon oxynitride (SiON) layer, and an amorphous silicon (a-Si) layer for various thicknesses at a wavelength of 365 nm. These layers were deposited on a silicon substrate and then reflectivity was measured. The graph indicates that the thickness of these anti-reflection layers impacts reflectivity. A reflectivity of 1 can mean that 100% of light emitted from a light source is reflected back. A reflectivity of 0 can mean that 0% of the light emitted from the light source is reflected. A first measurement result 30 is a result of reflectivity of the epoxy resin layer. A second measurement result 32 is a result of the SiON layer. A third measurement result 34 is a result of the a-Si layer. The first result 30 shows that the reflectivity is between about 0.1 and about 0.15 for thicknesses of the epoxy resin layer larger than about 50 nm.

FIG. 4B is a table with the lowest reflectivity values of the second and third results 32 and 34, respectively, of FIG. 4A. The second result 32 indicates that the lowest reflectivity can be obtained when the SiON layer has a thickness of about 110 nm. The third result 34 indicates that the lowest reflectivity can be obtained when the a-Si layer has a thickness of about 9 nm. The reflectivity of the anti-reflection layer can depend on a combination of a material of the anti-reflection layer and a thickness of the anti-reflection layer. The thickness of the anti-reflection layer can be selected to achieve a reflectivity that is no greater than a threshold value. For instance, the thickness of the anti-reflection layer can be selected such that the reflectivity is 0.2 or less for a given material of the anti-reflection layer. FIG. 4A indicates that a reflectivity of less than about 0.2 can be obtained with an amorphous silicon anti-reflection layer with a thickness in a range from about 5 nm to about 15 nm. FIG. 4A indicates that a reflectivity of less than about 0.2 can be obtained with an silicon oxynitride anti-reflection layer with a thickness in a range from about 105 nm to about 115 nm.

FIG. 5A is a graph of measurement results of line widths for different resist thicknesses of a resist film of a SAW resonator structure used in a lithography process. The SAW resonator structure used in the simulation of FIG. 5A does not include an anti-reflection layer between its IDT electrode and the resist film. A line width range r1 from a bottom side to a top side of the measurement curve can be observed from this graph. The line width range r1 of the measurement results of FIG. 5A is about 0.15 nm.

FIG. 5B is a graph of measurement results of line widths for different resist thicknesses of a resist film of a SAW resonator structure used in a lithography process. The SAW resonator structure used in the measurement of FIG. 5B includes an epoxy resin layer between its IDT electrode and the resist film. A line width range r2 from a bottom side to a top side of the measurement curve can be observed from this graph. The line width range r2 of the measurement results of FIG. 5B is about 0.05 nm.

FIG. 5C is a graph of measurement results of line width values for different resist thicknesses of a resist film of a SAW resonator structure according to an embodiment used in a lithography process. The SAW resonator structure used in the measurement of FIG. 5C includes an amorphous silicon (a-Si) layer between its IDT electrode and the resist film. A line width range r3 from a bottom side to a top side of the measurement curve can be observed from this graph. The line width range r3 of the measurement results of FIG. 5C is about 0.05 nm.

FIG. 5D is a graph of measurement results of line width values for different resist thicknesses of a resist film of a SAW resonator structure according to an embodiment used in a lithography process. The SAW resonator structure used in the measurement of FIG. 5D includes a silicon oxynitride (SiON) layer between its IDT electrode and the resist film. A line width range r4 from a bottom side to a top side of the measurement curve can be observed from this graph. The line width range r4 of the measurement results of FIG. 5D is about 0.1 nm.

Figure 6:
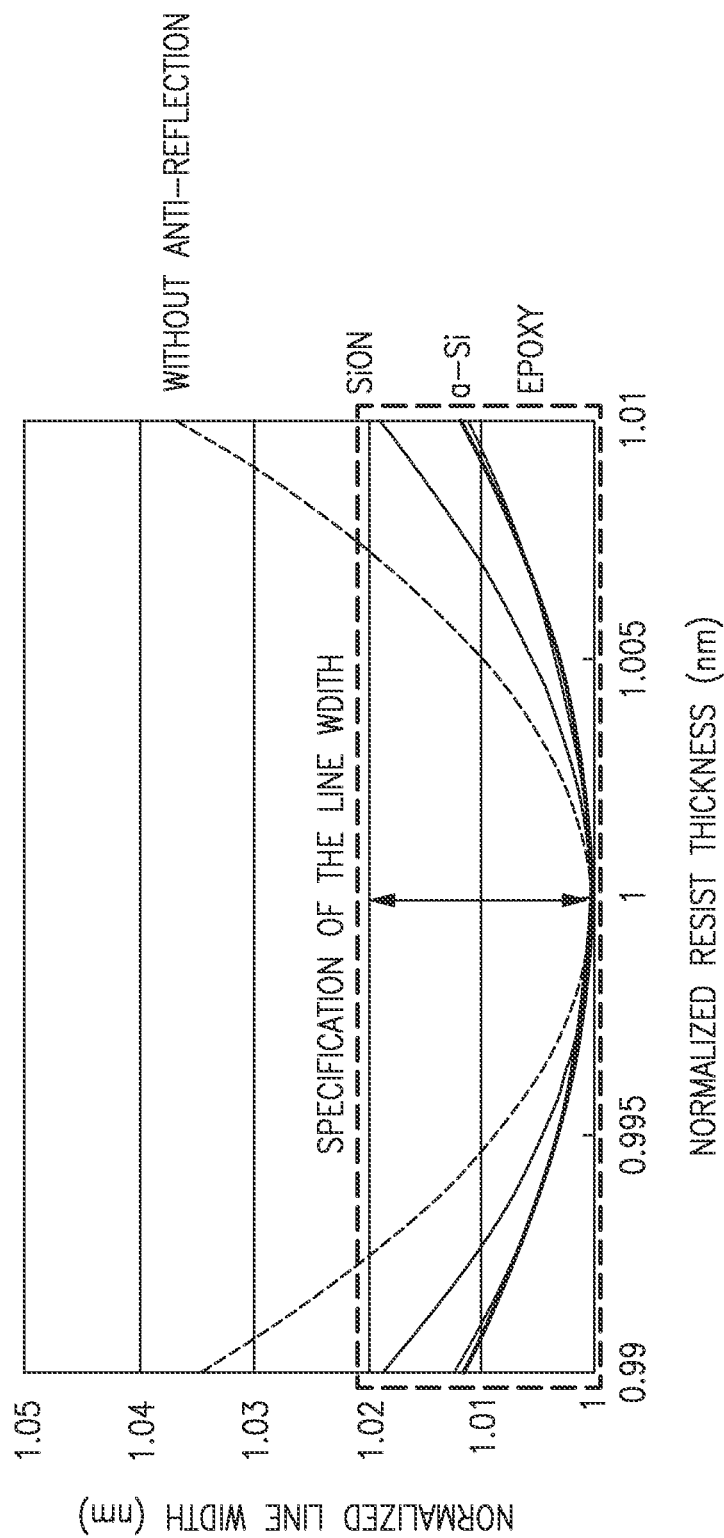
FIG. 6 is a graph of swing curves of data points at the bottom sides of the measurement results illustrated in FIGS. 5A-5D.

FIG. 6 is a graph of fit curves (also referred to as swing curves) of data points at the bottom sides of the measurement results curves illustrated in FIGS. 5A-5D. The graph shows normalized line width in nanometer on y-axis and normalized resist thickness in nanometer on x-axis. These results may be used in determining the thickness t5 of the anti-reflection layer 20 of FIGS. 2A and 2B that meets a desired specification.

For example, a specification for a SAW resonator may specify a resist thickness variation to be within 1% (e.g., +/−1% or a total variation of 2%), a frequency shift to be below 1 megahertz (MHz) at a frequency of 2 gigahertz (GHz), and a frequency shift sensitivity to be 0.85 MHz/nm. This specification can be for a Band 25 filter. In such specification, at a frequency (f) of 2 GHz and velocity (V) of 4000 m/s, line width can be calculated to be 0.5 μm. Also, to satisfy such specification, the line width distribution should be lower than about 1.18 nm (1 MHz frequency shift/0.85 MHz/nm frequency shift sensitivity), which is about 0.236% of the line width. Accordingly, with a line width distribution of 0.2% or less, stringent SAW resonator specifications can be met.

FIG. 7 illustrates a cross section of a surface acoustic wave resonator 3 according to an embodiment. The illustrated SAW resonator 3 includes a piezoelectric layer 10, an interdigital transducer (IDT) electrode 12' over the piezoelectric layer 10, an anti-reflection layer 20 over the IDT electrode 12', and a temperature compensation layer 18 over the anti-reflection layer 20. The SAW resonator 3 illustrated in FIG. 7 is generally similar to the SAW resonator 2 illustrated in FIG. 2B. However, unlike the SAW resonator 2, the IDT electrode 12' of the SAW resonator 3 is a multi-layer IDT electrode (e.g., includes two layers). As illustrated, the IDT electrode 12' includes an upper layer 24 and a lower layer 22 positioned between the upper layer 24 and the piezoelectric layer 10. The upper layer 24 can be an aluminum layer. The lower layer 22 can be a molybdenum layer, a tungsten layer, a gold layer, a tantalum layer, a platinum layer, a silver layer, or a ruthenium layer, for example. SAW resonators can include a multi-layer IDT electrode that includes three or more layers in some other embodiments. Any suitable principles and advantages disclosed herein can be applied to single layer IDT electrodes or multi-layer IDT electrodes that include two or more IDT layers.

Figure 8A:
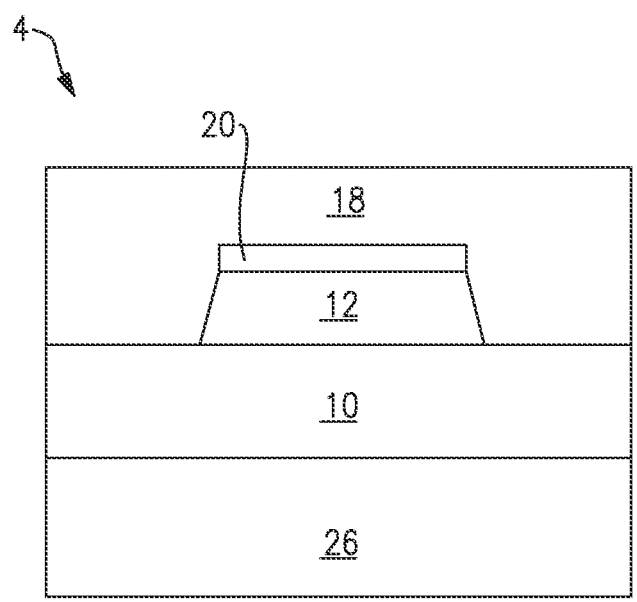
FIG. 8A illustrates a cross section of a SAW resonator according to another embodiment.
Figure 8B:
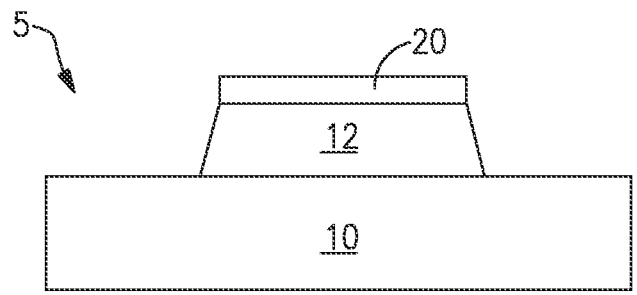
FIG. 8B illustrates a cross section of a SAW resonator according to another embodiment.
Figure 8C:
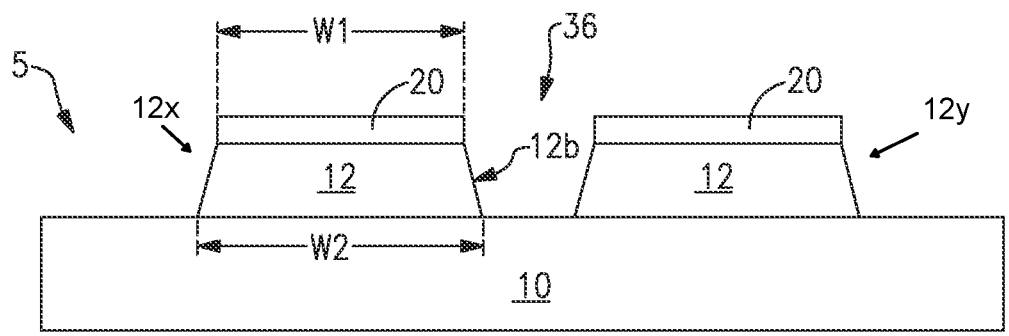
FIG. 8C illustrates another cross section of the SAW resonator illustrated in FIG. 8B.

FIG. 8A illustrates a cross section of a surface acoustic wave resonator 4 according to an embodiment. The illustrated SAW resonator 4 includes a support layer 26, a piezoelectric layer 10 over the support layer 26, an IDT electrode 12 over the piezoelectric layer 10, an anti-reflection layer 20 over the IDT electrode 12, and a temperature compensation layer 18 over the anti-reflection layer 20. FIG. 8A illustrates that the anti-reflection layers disclosed herein can be implemented in acoustic wave resonators that include multi-layer piezoelectric substrates. The SAW resonator 4 illustrated in FIG. 8A is generally similar to the SAW resonator 2 illustrated in FIG. 2B. However, unlike the SAW resonator 2, the SAW resonator 4 includes the support layer 26. By including the support layer 26, higher order spurious modes can be suppressed. In some embodiments, the support layer 26 can have a relatively high acoustic impedance. An acoustic impedance of the support layer 26 can be higher that ac acoustic impedance of the piezoelectric layer 10. The support layer 26 can be a silicon layer, a spinel layer, a magnesium oxide spinel layer, a quartz layer, a ceramic layer, a glass layer, a sapphire layer, a silicon nitride layer, an aluminum nitride layer, a diamond layer such as synthetic diamond layer, or the like. In some other embodiments (not illustrated), one or more additional layer can be included between the substrate layer and the piezoelectric layer. The one or more additional layers can include a silicon dioxide layer or a silicon nitride layer, for example.

FIG. 8B illustrates a cross section of a surface acoustic wave resonator 5 according to an embodiment. The illustrated SAW resonator 5 includes a piezoelectric layer 10, an IDT electrode 12 over the piezoelectric layer 10, and an anti-reflection layer 20 over the IDT electrode 12. The surface acoustic wave resonator 5 is like the surface acoustic wave resonator 2 of FIG. 2B, except that the SAW resonator 5 does not include the temperature compensation layer 18. In certain embodiments, a lithium tantalate layer may be a more suitable piezoelectric material than the lithium niobate layer when there is no temperature compensation layer present in the SAW resonator. A SAW resonator without a temperature compensation layer over an IDT electrode can include a multi-layer IDT electrode in certain instances. Alternatively or additionally, a SAW resonator without a temperature compensation layer over the IDT electrode can include a multi-layer piezoelectric substrate.

FIG. 8C illustrates another cross section of the surface acoustic wave resonator 5 illustrated in FIG. 8B. The illustrated SAW resonator 5 includes the piezoelectric layer 10, the IDT electrode 12 over the piezoelectric layer 10, the anti-reflection layer 20 over the IDT electrode 12. The IDT electrode 12 includes a first IDT electrode finger 12x extending from a first bus bar (not shown) and a second IDT finger 12y extending from a second bus bar (not shown). The first IDT electrode finger 12x and the second IDT electrode finger 12y are spaced apart from each other by a gap 36. The gap 36 can be free from the anti-reflection layer 20. The portion of the piezoelectric layer 10 under the gap 36 is free from the anti-reflection layer 20.

In some embodiments, the anti-reflection layer 20 can be patterned such that the anti-reflection layer 20 substantially covers an upper surface of IDT fingers of the IDT electrode 12. A width W1 of the anti-reflection layer 20 over IDT electrode finger 12x and a width W2 of the IDT electrode finger 12x can be generally similar. In some embodiments the width W1 of the anti-reflection layer 20 over the IDT electrode finger 12x can be the same as or shorter than the width W2 of the IDT electrode finger 12x. In some embodiments, a side wall 12b of the IDT electrode finger 12x that extends from a lower surface of the IDT electrode finger 12x to the upper surface of the IDT electrode finger 12x, can be perpendicular with an upper surface of the piezoelectric layer 10, or tapered. The side wall 12b of the IDT electrode finger 12x can be free from the anti-reflection layer 20. The anti-reflection layer 20 can have a footprint that corresponds to a footprint of IDT electrode fingers of the IDT electrode 12 in the acoustically active part of the SAW resonator 5.

The SAW resonator 5 and/or any other SAW resonators disclosed herein can include part of the anti-reflection layer 20 over a bus bar of the IDT electrode 12. In some other embodiments, a bus bar can be free from the anti-reflection layer 20. In some other embodiments, a bus bar can partly covered by the anti-reflection layer 20 and partly free from the anti-reflection layer 20.

Figure 9A:
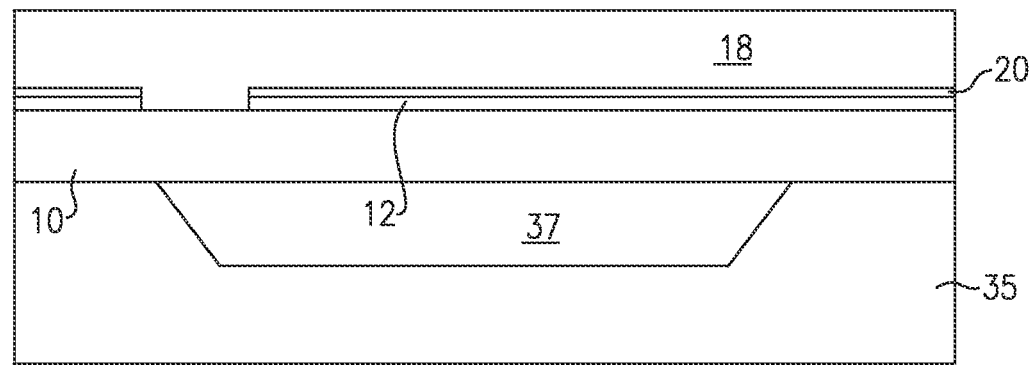
FIG. 9A illustrates a cross section of a Lamb wave device according to an embodiment.

FIG. 9A illustrates a cross section of a Lamb wave device 7 according to an embodiment. The Lamb wave device 7 can be a Lamb wave resonator. The Lamb wave device 7 includes a piezoelectric layer 10, an IDT electrode 12 over the piezoelectric layer 10, an anti-reflection layer 20 over the IDT electrode 12, and a temperature compensation layer 18 over the piezoelectric layer 10. The Lamb wave device 7 also includes a substrate 35, and an air cavity 37 between the piezoelectric layer 10 and the substrate 35. The substrate 35 can include any suitable material. For example, the substrate 35 can be a semiconductor substrate, such as a silicon substrate. As illustrated, the Lamb wave device 7 includes part of the anti-reflection layer 20 over a bus bar of the IDT electrode 12. In some other embodiments (not illustrated), a bus bar can be free from the anti-reflection layer. In some other embodiments (not illustrated), a bus bar can partly covered by the anti-reflection layer and partly free from the anti-reflection layer.

Figure 9B:
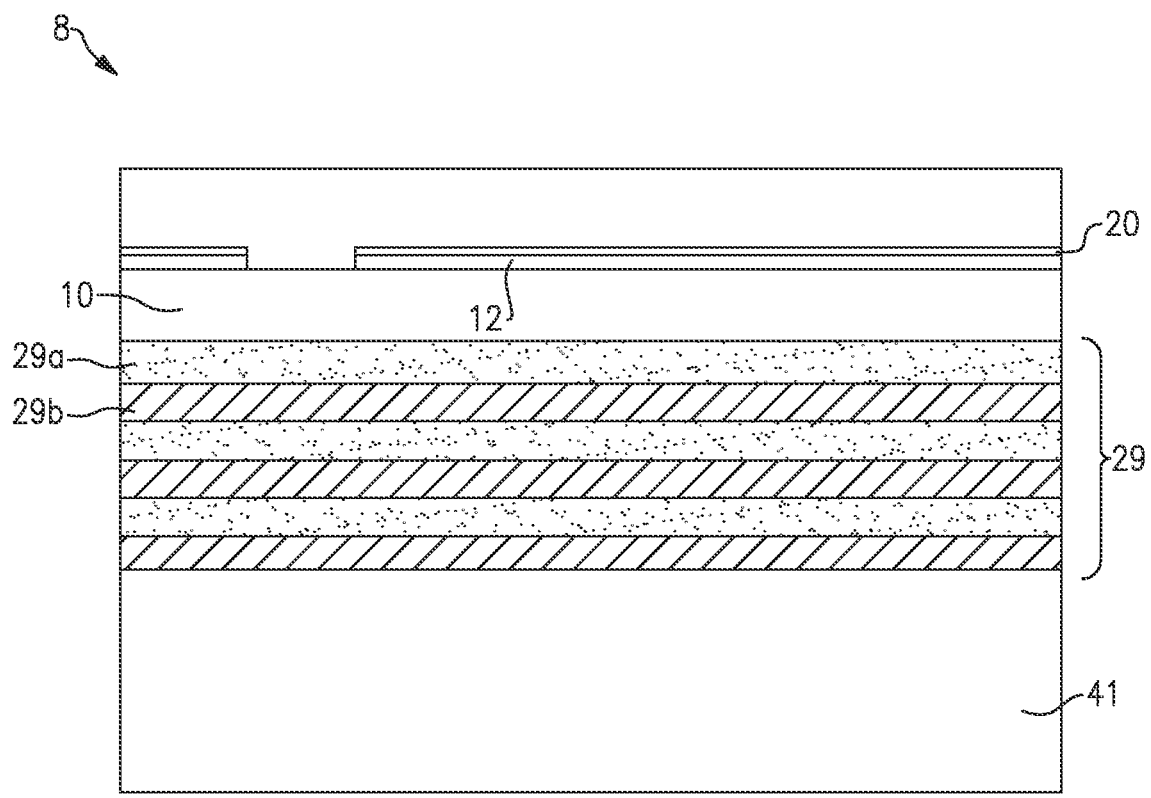
FIG. 9B illustrates a cross section of a Lamb wave device according to another embodiment.

FIG. 9B illustrates a cross section of a Lamb wave device 8 according to another embodiment. The Lamb wave device 8 can be a Lamb wave resonator. The Lamb wave device 8 is like the Lamb wave device 7 of FIG. 9A except that the Lamb wave device 8 includes a solid acoustic mirror 29 and a substrate 41 in place of the substrate 35 and the cavity 37. The solid acoustic mirror 29 can include acoustic Bragg reflectors. For instance, the solid acoustic mirror 29 can include alternating layers of a low impedance layer 29a and a high impedance layer 29b. As one example, the low impedance layer 29a can be a silicon dioxide layer and the high impedance layer 29b can be a tungsten layer. As another example, the low impedance layer 29a can be a silicon dioxide layer and the high impedance layer 29b can be a molybdenum layer. The substrate 41 can include any suitable material. For example, the substrate 41 can be a semiconductor substrate, such as a silicon substrate.

A method of manufacturing an acoustic wave device according to an embodiment will now be described. The method can include providing a piezoelectric layer and forming (e.g., depositing) an interdigital transducer electrode material over the piezoelectric layer. The interdigital transducer electrode material can include aluminum. The method can include forming (e.g., depositing) an anti-reflection layer over the interdigital transducer electrode material. The anti-reflection material can remain distinct from the interdigital transducer material after a heating process. The anti-reflection material can reduce reflections from the interdigital transducer material during photolithography. The method can include forming (e.g., depositing) a resist film over the anti-reflection layer. The resist film can be patterned, for example, by a stepper. The method can include patterning (e.g., etching) the interdigital transducer electrode material to form an interdigital transducer electrode. The method can include removing the resist film. The method can include forming (e.g., depositing) a temperature compensation layer over at least a portion of the piezoelectric layer, the interdigital transducer electrode, and/or the anti-reflection layer.

A SAW device including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW devices disclosed herein. FR1 can be from 410 MHz to 7.125 GHz, for example, as specified in a current 5G NR specification. One or more SAW devices in accordance with any suitable principles and advantages disclosed herein can be included in a filter arranged to filter a radio frequency signal in a 4G LTE operating band and/or in a filter having a passband that includes a fourth generation (4G) Long Term Evolution (LTE) operating band and a 5G NR operating band.

Acoustic wave devices disclosed herein can be implemented in a standalone filter. Acoustic wave devices disclosed herein can be implemented in one or more filters of multiplexer (e.g., a duplexer) with fixed multiplexing. Acoustic wave devices disclosed herein can be implemented in one or more filters of multiplexer with switched multiplexing. Acoustic wave devices disclosed herein can be implemented in one or more filters of a multiplexer with a combination of fixed multiplexing and switched multiplexing.

Figure 10A:
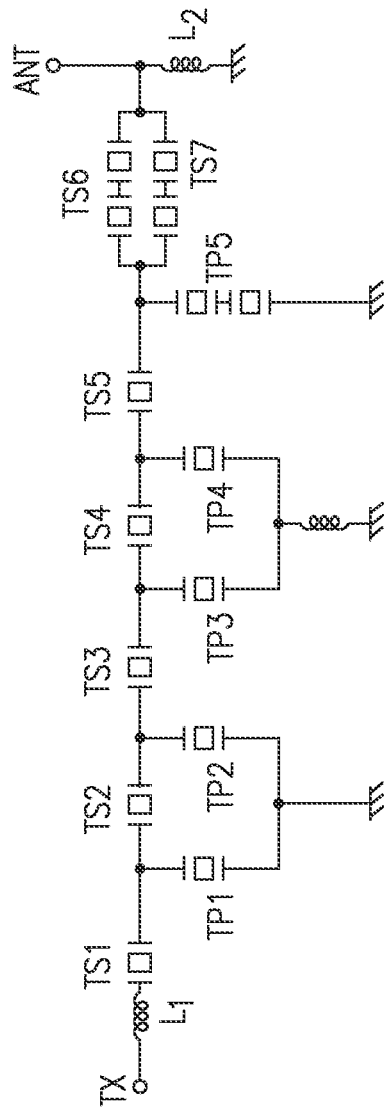
FIG. 10A is a schematic diagram of a transmit filter that includes a surface acoustic wave resonator according to an embodiment.

FIG. 10A is a schematic diagram of an example transmit filter 45 that includes surface acoustic wave resonators of a surface acoustic wave component according to an embodiment. The transmit filter 45 can be a band pass filter. The illustrated transmit filter 45 is arranged to filter a radio frequency signal received at a transmit port TX and provide a filtered output signal to an antenna port ANT. The transmit filter 45 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1, TS2, TS3, TS4, TS5, TS6, and TS7 and/or TP1, TP2, TP3, TP4, and TP5 can be a SAW resonators with an anti-reflection layer in accordance with any suitable principles and advantages disclosed herein. For instance, one or more of the SAW resonators of the transmit filter 45 can be a surface acoustic wave resonator 2 of FIG. 2B. Alternatively or additionally, one or more of the SAW resonators of the transmit filter 45 can be any surface acoustic wave resonators disclosed herein (e.g., a surface acoustic wave resonator 3 of FIG. 7, a surface acoustic wave resonator 4 of FIG. 8A, or a surface acoustic wave resonator 5 of FIGS. 8B and 8C). Any suitable number of series SAW resonators and shunt SAW resonators can be included in a transmit filter 45.

Figure 10B:
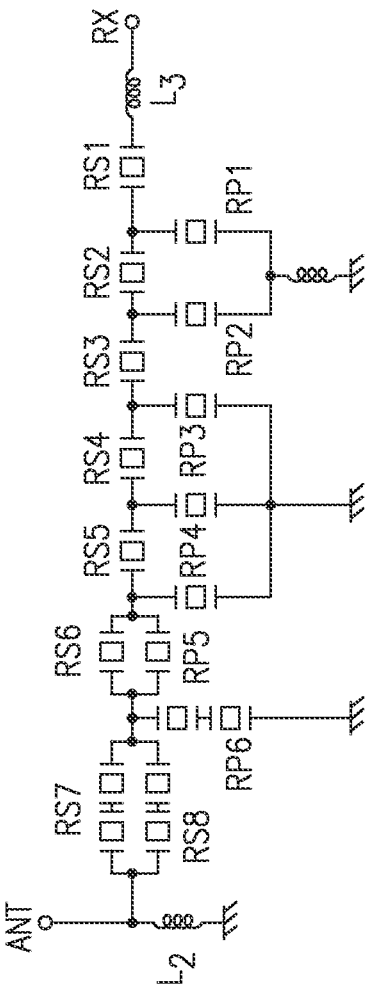
FIG. 10B is a schematic diagram of a receive filter that includes a surface acoustic wave resonator according to an embodiment.

FIG. 10B is a schematic diagram of a receive filter 50 that includes surface acoustic wave resonators of a surface acoustic wave component according to an embodiment. The receive filter 50 can be a band pass filter. The illustrated receive filter 50 is arranged to filter a radio frequency signal received at an antenna port ANT and provide a filtered output signal to a receive port RX. The receive filter 50 includes series SAW resonators RS1, RS2, RS3, RS4, RS5, RS6, RS7, and RS7, shunt SAW resonators RP1, RP2, RP3, RP4, and RP5, and RP6, shunt inductor L2, and series output inductor L3. Some or all of the SAW resonators RS1, RS2, RS3, RS4, RS5, RS6, RS7, and RS8 and/or RP1, RP2, RP3, RP4, RP5, and RP6 can be SAW resonators with an anti-reflection layer in accordance with any suitable principles and advantages disclosed herein. For instance, one or more of the SAW resonators of the receive filter 50 can be a surface acoustic wave resonator 2 of FIG. 2B. Alternatively or additionally, one or more of the SAW resonators of the receive filter 50 can be any surface acoustic wave resonator disclosed herein (e.g., a surface acoustic wave resonator 3 of FIG. 7, a surface acoustic wave resonator 4 of FIG. 8A, or a surface acoustic wave resonator 5 of FIGS. 8B and 8C). Any suitable number of series SAW resonators and shunt SAW resonators can be included in a receive filter 50.

Figure 11:
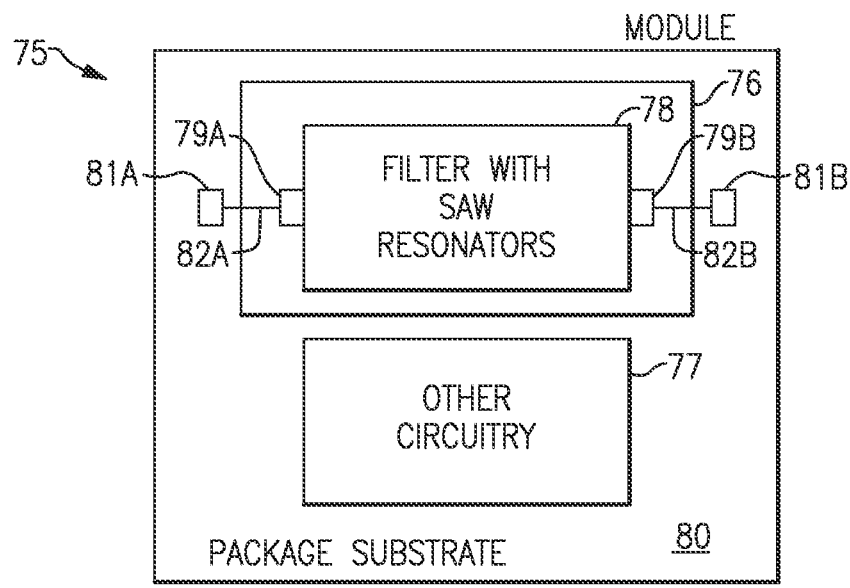
FIG. 11 is a schematic diagram of a radio frequency module that includes a surface acoustic wave component according to an embodiment.

FIG. 11 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW resonators with any suitable combination of features of the SAW resonators and/or acoustic wave devices disclosed herein. The SAW component 76 can include a SAW die that includes SAW resonators.

The SAW component 76 shown in FIG. 11 includes a filter 78 and terminals 79A and 79B. The filter 78 includes SAW resonators. One or more of the SAW resonators can be implemented in accordance with any suitable principles and advantages of the surface acoustic wave resonator 2 of FIG. 2B and/or any surface acoustic wave resonator disclosed herein. The filter 78 can be a TC-SAW filter arranged as a band pass filter to filter radio frequency signals with frequencies below about 3.5 GHz in certain applications. The terminals 79A and 78B can serve, for example, as an input contact and an output contact. The SAW component 76 and the other circuitry 77 are on a common packaging substrate 80 in FIG. 11. The package substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 75. The overmold structure can encapsulate some or all of the components of the radio frequency module 75.

Figure 12:
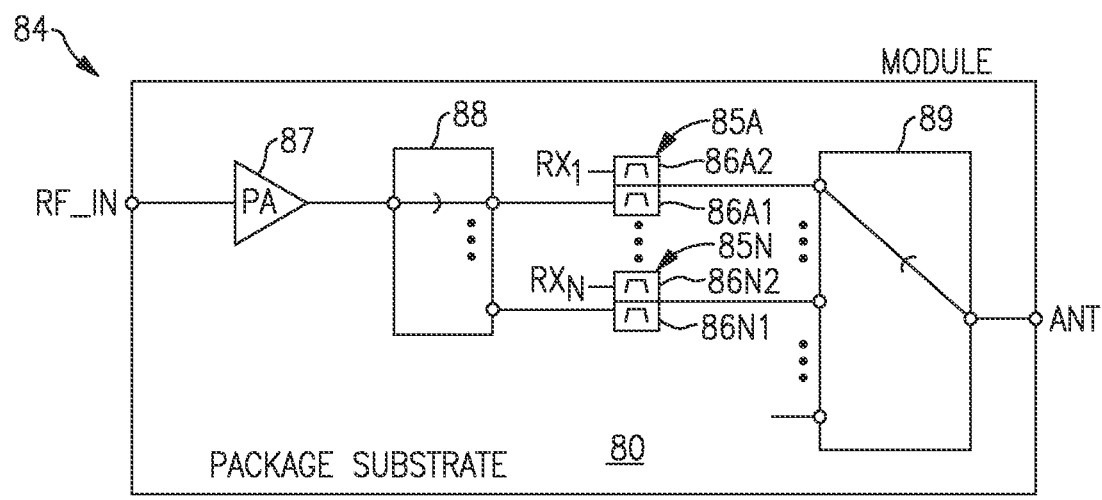
FIG. 12 is a schematic diagram of a radio frequency module that includes duplexers with surface acoustic wave resonators according to an embodiment.

FIG. 12 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 12 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 13A:
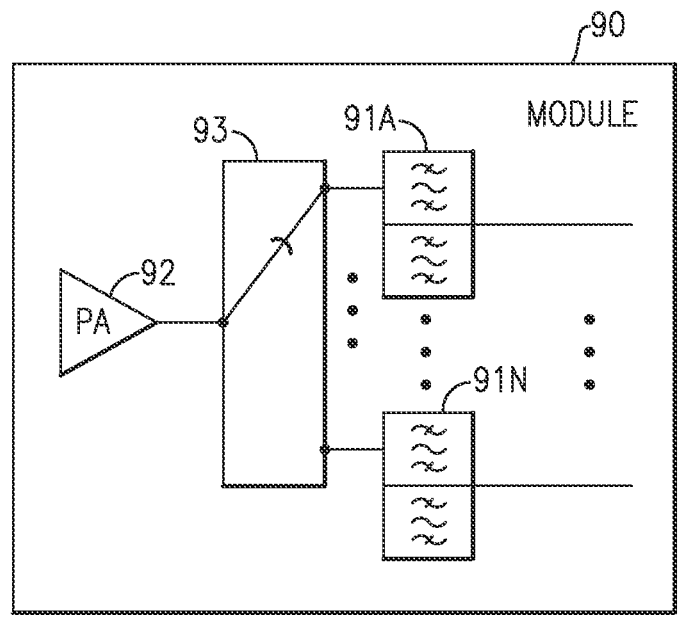
FIG. 13A is a schematic block diagram of a module that includes a power amplifier, a radio frequency switch, and duplexers that include one or more surface acoustic wave resonators with an anti-reflection layer according to an embodiment.

FIG. 13A is a schematic block diagram of a module 90 that includes a power amplifier 92, a radio frequency switch 93, and duplexers 91A to 91N in accordance with one or more embodiments. The power amplifier 92 can amplify a radio frequency signal. The radio frequency switch 93 can be a multi-throw radio frequency switch. The radio frequency switch 93 can electrically couple an output of the power amplifier 92 to a selected transmit filter of the duplexers 91A to 91N. One or more filters of the duplexers 91A to 91N can include any suitable number of surface acoustic wave resonators with an anti-reflection layer in accordance with any suitable principles and advantages discussed herein. Any suitable number of duplexers 91A to 91N can be implemented.

Figure 13B:
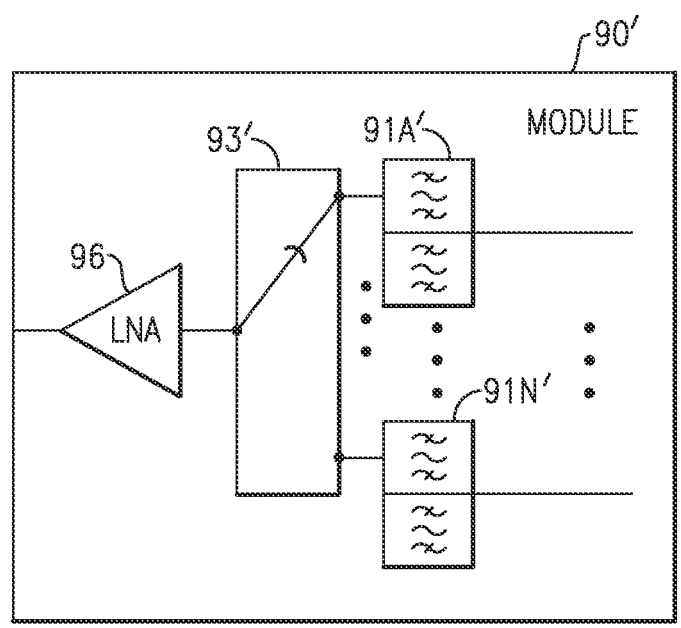
FIG. 13B is a schematic block diagram of a module that includes filters, a radio frequency switch, and a low noise amplifier according to an embodiment.

FIG. 13B is a schematic block diagram of a module 90' that includes filters 91A' to 91N', a radio frequency switch 93', and a low noise amplifier 96 according to an embodiment. One or more filters of the filters 91A' to 91N' can include any suitable number of acoustic wave resonators in accordance with any suitable principles and advantages disclosed herein. Any suitable number of filters 91A' to 91N' can be implemented. The illustrated filters 91A' to 91N' are receive filters. In some embodiments (not illustrated), one or more of the filters 91A' to 91N' can be included in a multiplexer that also includes a transmit filter. The radio frequency switch 93' can be a multi-throw radio frequency switch. The radio frequency switch 93' can electrically couple an output of a selected filter of filters 91A' to 91N' to the low noise amplifier 96. In some embodiments (not illustrated), a plurality of low noise amplifiers can be implemented. The module 90' can include diversity receive features in certain applications.

Figure 14:
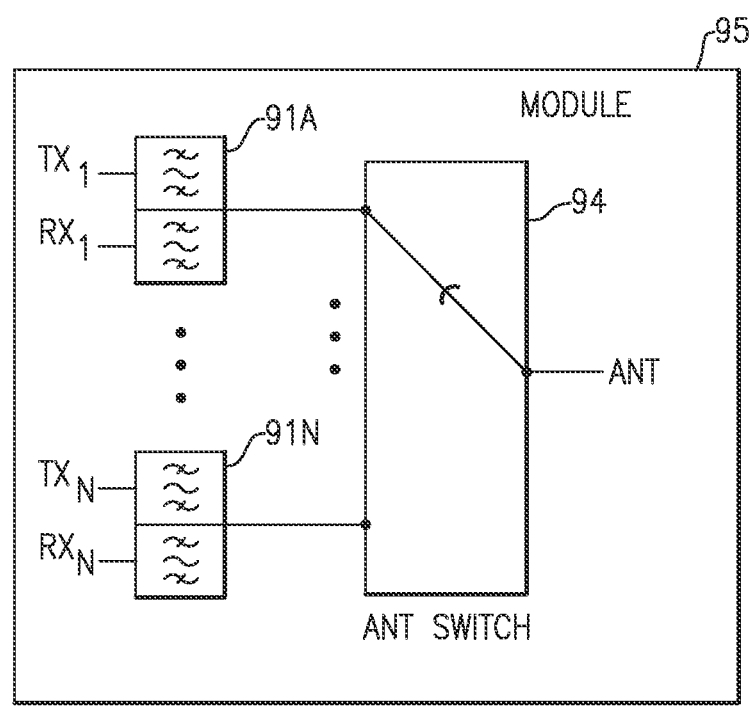
FIG. 14 is a schematic block diagram of a module that includes an antenna switch and duplexers that include one or more surface acoustic wave resonators with an anti-reflection layer according to an embodiment.

FIG. 14 is a schematic block diagram of a module 95 that includes duplexers 91A to 91N and an antenna switch 94. One or more filters of the duplexers 91A to 91N can include any suitable number of surface acoustic wave resonators with an anti-reflection layer in accordance with any suitable principles and advantages discussed herein. Any suitable number of duplexers 91A to 91N can be implemented. The antenna switch 94 can have a number of throws corresponding to the number of duplexers 91A to 91N. The antenna switch 94 can electrically couple a selected duplexer to an antenna port of the module 95.

Figure 15A:
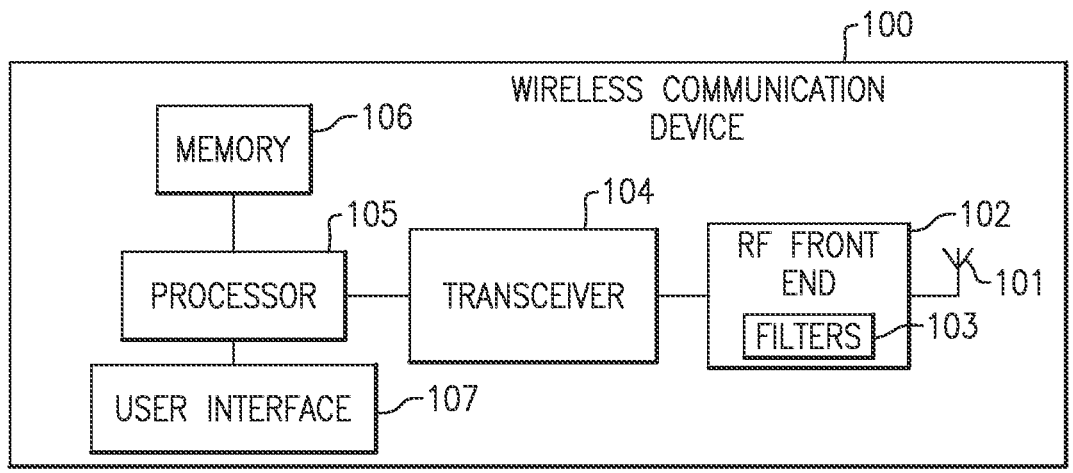
FIG. 15A is a schematic block diagram of a wireless communication device that includes a filter in accordance with one or more embodiments.

FIG. 15A is a schematic diagram of a wireless communication device 100 that includes filters 103 in a radio frequency front end 102 according to an embodiment. The filters 103 can include one or more SAW resonators in accordance with any suitable principles and advantages discussed herein. The wireless communication device 100 can be any suitable wireless communication device. For instance, a wireless communication device 100 can be a mobile phone, such as a smart phone. As illustrated, the wireless communication device 100 includes an antenna 101, an RF front end 102, a transceiver 104, a processor 105, a memory 105, and a user interface 107. The antenna 101 can transmit RF signals provided by the RF front end 102. Such RF signals can include carrier aggregation signals. Although not illustrated, the wireless communication device 90 can include a microphone and a speaker in certain applications.

The RF front end 102 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 102 can transmit and receive RF signals associated with any suitable communication standards. The filters 103 can include SAW resonators of a SAW component that includes any suitable combination of features discussed with reference to any embodiments discussed above.

The transceiver 104 can provide RF signals to the RF front end 102 for amplification and/or other processing. The transceiver 104 can also process an RF signal provided by a low noise amplifier of the RF front end 102. The transceiver 104 is in communication with the processor 105. The processor 105 can be a baseband processor. The processor 105 can provide any suitable base band processing functions for the wireless communication device 100. The memory 106 can be accessed by the processor 105. The memory 106 can store any suitable data for the wireless communication device 100. The user interface 107 can be any suitable user interface, such as a display with touch screen capabilities.

Figure 15B:
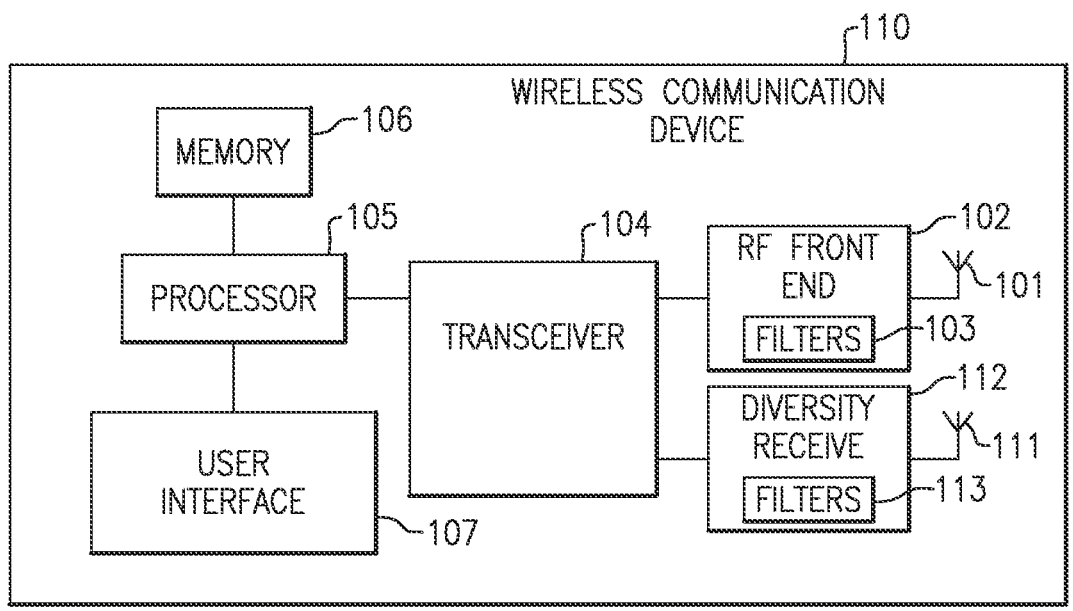
FIG. 15B is a schematic block diagram of another wireless communication device that includes a filter in accordance with one or more embodiments.

FIG. 15B is a schematic diagram of a wireless communication device 110 that includes filters 103 in a radio frequency front end 102 and second filters 113 in a diversity receive module 112. The wireless communication device 110 is like the wireless communication device 100 of FIG. 15A, except that the wireless communication device 120 also includes diversity receive features. As illustrated in FIG. 15B, the wireless communication device 120 includes a diversity antenna 111, a diversity module 112 configured to process signals received by the diversity antenna 111 and including filters 113, and a transceiver 104 in communication with both the radio frequency front end 102 and the diversity receive module 112. The filters 113 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators and/or acoustic wave devices, such as Lamb wave resonators and/or boundary wave resonators. For example, any suitable combination of features of an anti-reflection layer over an IDT electrode disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave components and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of manufacturing an acoustic wave device, the method comprising:
 providing an acoustic wave device structure with at least one interdigital transducer electrode on a piezoelectric layer;
 forming an anti-reflection layer over the interdigital transducer electrode, the anti-reflection layer including silicon; and
 etching the interdigital transducer electrode, the anti-reflection layer reducing reflection from the interdigital transducer electrode.

2. The method of claim 1 wherein the interdigital transducer electrode includes aluminum.

3. The method of claim 1 wherein the anti-reflection layer has a reflectivity of 0.2 or less for light having a wavelength of 365 nanometers.

4. The method of claim 1 wherein the interdigital transducer electrode has a reflectivity of at least 0.5 for light having a wavelength of 365 nanometers.

5. The method of claim 1 further comprising forming a temperature compensation layer over the anti-reflection layer.

6. The method of claim 1 wherein the anti-reflection layer remains distinct from the interdigital transducer electrode after a heating process.

7. The method of claim 1 wherein the anti-reflection layer is a silicon oxynitride layer.

8. The method of claim 1 wherein the anti-reflection layer is an amorphous silicon layer.

9. The method of claim 1 wherein the anti-reflection layer is a silicon dioxide layer.

10. The method of claim 1 wherein the anti-reflection layer does not include carbon.

11. The method of claim 1 wherein a line width distribution of the interdigital transducer electrode is 2% of a line width or less.

12. The method of claim 1 wherein the interdigital transducer electrode has a line width in range from 0.25 micrometers to 0.4 micrometers.

13. The method of claim 1 wherein the interdigital transducer electrode includes an aluminum layer and a molybdenum layer.

14. A method of manufacturing an acoustic wave device, the method comprising:
 providing an acoustic wave device structure with at least one interdigital transducer electrode on a piezoelectric layer;
 forming an anti-reflection layer over the interdigital transducer electrode, the anti-reflection layer having a reflectivity of 0.3 or less for light having a wavelength of 365 nanometers, and the anti-reflection layer remaining distinct from the interdigital transducer electrode after a heating process; and
 etching the interdigital transducer electrode, the anti-reflection layer reducing reflection from the interdigital transducer electrode.

15. The method of claim 14 wherein the reflectivity of the anti-reflection layer is 0.2 or less for light with the wavelength of 365 nanometers.

16. The method of claim 14 further comprising forming a temperature compensation layer over the interdigital transducer electrode.

17. A method of manufacturing an acoustic wave device, the method comprising:
 providing an acoustic wave device structure with at least one interdigital transducer electrode on a piezoelectric layer, the interdigital transducer electrode including an aluminum layer;
 forming an anti-reflection layer over the aluminum layer, the anti-reflection layer remaining distinct from the aluminum layer after a heating process; and
 etching the interdigital transducer electrode, the anti-reflection layer reducing reflection from the aluminum layer.

18. The method of claim 17 wherein a reflectivity of the anti-reflection layer is 0.2 or less for light with a wavelength of 365 nanometers.

19. The method of claim 17 wherein the anti-reflection layer is an amorphous silicon layer having a thickness in a range from 5 nanometers to 15 nanometers.

20. The method of claim 17 wherein the anti-reflection layer is a silicon oxynitride layer having a thickness in a range from 100 nanometers to 120 nanometers.

* * * * *